(12) United States Patent
Kinoshita et al.

(10) Patent No.: US 7,547,885 B2
(45) Date of Patent: Jun. 16, 2009

(54) RADIATION DETECTOR

(75) Inventors: Haruhisa Kinoshita, Hamamatsu (JP);
Masanori Kinpara, Hamamatsu (JP);
Michiatsu Nakada, Hamamatsu (JP);
Syouji Kurebayashi, Hamamatsu (JP);
Hideyuki Suzuki, Hamamatsu (JP);
Toshiaki Kawai, Hamamatsu (JP)

(73) Assignees: National University Corporation Shizuoka University, Shizuoka-shi, Shizuoka (JP); Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/000,664

(22) Filed: Dec. 14, 2007

(65) Prior Publication Data

US 2008/0164412 A1 Jul. 10, 2008

(30) Foreign Application Priority Data

Dec. 18, 2006 (JP) .............................. 2006-340318

(51) Int. Cl.
*G01T 1/00* (2006.01)

(52) U.S. Cl. .................................................. 250/336.1

(58) Field of Classification Search ............... 250/336.1
See application file for complete search history.

(56) References Cited

U.S. PATENT DOCUMENTS

| 6,171,643 | B1 | 1/2001 | Polischuk et al. |
| 6,607,642 | B1 * | 8/2003 | Kiesele et al. ............... 204/415 |
| 2004/0195513 | A1 * | 10/2004 | Zentai et al. ........... 250/370.01 |

FOREIGN PATENT DOCUMENTS

| EP | 1 079 437 A2 | 2/2001 |
| JP | 2000-307091 | 11/2000 |
| JP | 2003-209238 | 7/2003 |
| JP | 2003209238 A * | 7/2003 |
| JP | 2005-86059 | 3/2005 |

OTHER PUBLICATIONS

Liu et al. Electrical behaviour of metal/tetrahedral amorphous carbon/metal structure, Solid-State Electronics, vol. 43, No. 2 (Feb. 1999), pp. 427-434.*

(Continued)

*Primary Examiner*—David P Porta
*Assistant Examiner*—Shun Lee
(74) *Attorney, Agent, or Firm*—Drinker Biddle & Reath LLP (57) ABSTRACT

A radiation detector includes a signal readout substrate. The signal readout substrate is constructed by arranging pixel units having pixel electrodes in a two-dimensional matrix form on a front surface of a substrate. On a front surface of the signal readout substrate, formed is a photoconductive layer having crystallinity. On a front surface of the photoconductive layer, formed is a contact assistance layer having conductivity. On a front surface of the contact assistance layer, formed is a common electrode. A surface area per unit region of the front surface of the contact assistance layer is smaller than a surface area per unit region of the front surface of the photoconductive layer. In addition, the contact assistance layer is formed so as to include the common electrode and so as to be included in the front surface of the photoconductive layer when viewed from the front.

6 Claims, 10 Drawing Sheets

OTHER PUBLICATIONS

Fornaro et al., "Perspectives of the Heavy Metal Halides Family for Direct and Digital X-Ray Imaging," 2005 IEEE Nuclear Science Symposium Conference Record Oct. 23, 2005; vol. 2, pp. 878-881.

Grill et al., "Electrical and Optical Properties of Diamond-Like Carbon," Thin Solid Films; Nov. 1, 1999; vol. 335-356, pp. 189-193.

* cited by examiner

RADIATION DETECTOR

BACKGROUND OF THE INVENTION

1. Field of the Invention

The present invention relates to a radiation detector for detecting radiation such as X-rays, γ-rays, and the like.

2. Related Background Art

Conventionally, techniques for detecting radiation include an indirect conversion method and a direct conversion method. According to the indirect conversion method, radiation is once converted to light and said light is converted to an electrical signal, while according to the direct conversion method, radiation is directly converted to an electrical signal. Therefore, the direct conversion method has a feature that the resolution is higher than that of the indirect conversion method where the resolution can possibly be degraded by scattering of light. For this reason, in recent years, radiation detectors by the direct conversion method have been attracting attention.

As the radiation detector by the direct conversion method, known is one including a substrate, a signal readout substrate having a plurality of pixel electrodes arranged one-dimensionally or two-dimensionally on a front surface (a surface on the side where radiation is made incident) of said substrate, a photoconductive layer formed on a front surface of the signal readout substrate, and a common electrode formed on a front surface of the photoconductive layer (see Japanese Published Unexamined Patent Application No. 2003-209238, for example).

SUMMARY OF THE INVENTION

However, in such a radiation detector as described above, as shown in FIG. 10, since unevenness exists on a front surface 47a of a photoconductive layer 47 when the photoconductive layer 47 has crystallinity, it is easy to form a common electrode 48 on convex parts of the front surface 47a, while it is difficult to form a common electrode 48 on concave parts. Therefore, as a result of the common electrode 48 being discontinuously formed, the common electrode 48 may have a high resistance. Here, in order to suppress the common electrode 48 from having a high resistance, it can be considered to form the common electrode 48 thick, however, in this case, the common electrode 48 easily peels off, and an image defect or the like may occur due to the peeled common electrode 48.

It is therefore an object of the present invention to provide a radiation detector that can not only suppress its common electrode from having a high resistance and but also prevent the common electrode from peeling.

In order to achieve the above object, a radiation detector according to the present invention is a radiation detector for detecting radiation, including: a substrate and a signal readout substrate having a plurality of pixel electrodes arranged one-dimensionally or two-dimensionally on one main-surface side of said substrate; a crystalline photoconductive layer formed on one main-surface side of the signal readout substrate; a conductive intermediate layer formed on one main-surface side of the crystalline photoconductive layer; and a common electrode formed on one main surface of the conductive intermediate layer, wherein a surface area per unit region of the one main surface of the conductive intermediate layer is smaller than a surface area per unit region of one main surface of the crystalline photoconductive layer, and the conductive intermediate layer is formed so as to include the common electrode and so as to be included in the one main surface of the crystalline photoconductive layer when viewed from one side.

In this radiation detector, the surface area per unit region of the one main surface of the conductive intermediate layer is smaller than the surface area per unit region of the one main surface of the crystalline photoconductive layer. Therefore, the degree of unevenness of the main surface of the conductive intermediate layer is moderated relative to the degree of unevenness of the one main surface of the crystalline photoconductive layer. Thereby, as a result the common electrode being formed on the one main surface of the conductive intermediate layer, the common electrode can be prevented from being discontinuously formed even without thickening the common electrode, so that it becomes possible to not only suppress the common electrode from having a high resistance but also prevent the common electrode from peeling. Here, the conductive intermediate layer means a layer made of a material having conductivity, which includes not only a conductor but also a semiconductor. The crystalline photoconductive layer means a photoconductive layer having crystallinity (having a crystal structure). The unit region means a region corresponding to a unit area when this is viewed from one side.

In addition, since the conductive intermediate layer is formed so as to include the common electrode and so as to be included in the main surface of the crystalline photoconductive layer when viewed from the front, peeling of the common electrode due to peeling of the conductive intermediate layer can be prevented. This is based on the following reasons. Specifically, since an internal stress is generated when forming the conductive intermediate layer, the conductive intermediate layer formed on the uneven main surface of the crystalline photoconductive layer is difficult to peel off, while the conductive intermediate layer formed on a smooth part other than main surface is easy to peel off. Therefore, as described above, by forming the main surface of the conductive intermediate layer so as to include the common electrode and so as to be included in the crystalline photoconductive layer when viewed from one side, the crystalline photoconductive layer and the conductive intermediate layer can be reliably joined to each other.

Here, it is preferable that the thickness of the conductive intermediate layer is 1 μm to 5 μm. This is because the degree of unevenness of the main surface of the crystalline photoconductive layer cannot be sufficiently moderated if the thickness of the conductive intermediate layer is less than 1 μm, while a signal charge generated in the crystalline photoconductive layer by an incidence of radiation is considerably lost if the thickness of the conductive intermediate layer is more than 5 μm.

In addition, it is preferable that the specific resistance value of the conductive intermediate layer is $10^{-2}$ to $10^{-6}$ times as large as the specific resistance value of the crystalline photoconductive layer. Thereby, a signal charge generated in the crystalline photoconductive layer can be smoothly moved to the common electrode via the conductive intermediate layer.

In addition, it is preferable that the conductive intermediate layer contains diamond-like carbon. In this case, since the diamond-like carbon has a characteristic of being difficult to absorb radiation, absorption of radiation in the conductive intermediate layer is reduced, and thus it becomes possible to detect radiation at a high sensitivity.

At this time, it is preferable that the conductive intermediate layer is doped with nitrogen atoms. In this case, the specific resistance value of the conductive intermediates layer can be easily adjusted, and for example, it becomes possible to easily adjust the specific resistance value of the conductive intermediate layer to $10^{-2}$ to $10^{-6}$ times as large as the specific resistance value of the crystalline photoconductive layer.

DESCRIPTION OF THE PREFERRED EMBODIMENTS

Hereinafter, a preferred embodiment of the present invention will be described in detail with reference to the accompanying drawings. Here, in the description of the drawings, identical or corresponding components are denoted with identical reference numerals so as to avoid overlapping descriptions.

Figure 1:
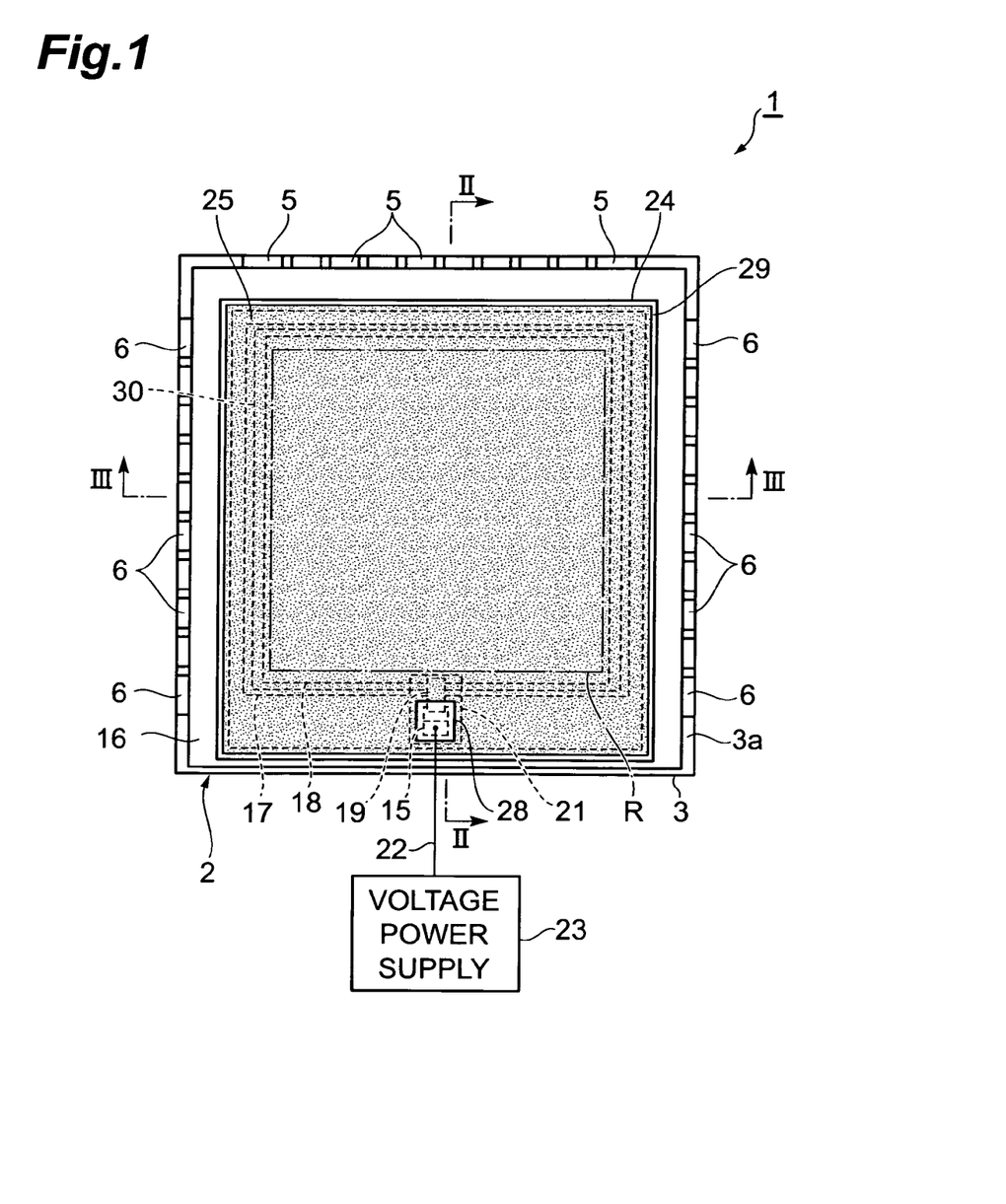
FIG. 1 is a plane view showing an embodiment of a radiation detector according to the present invention.
Figure 2:
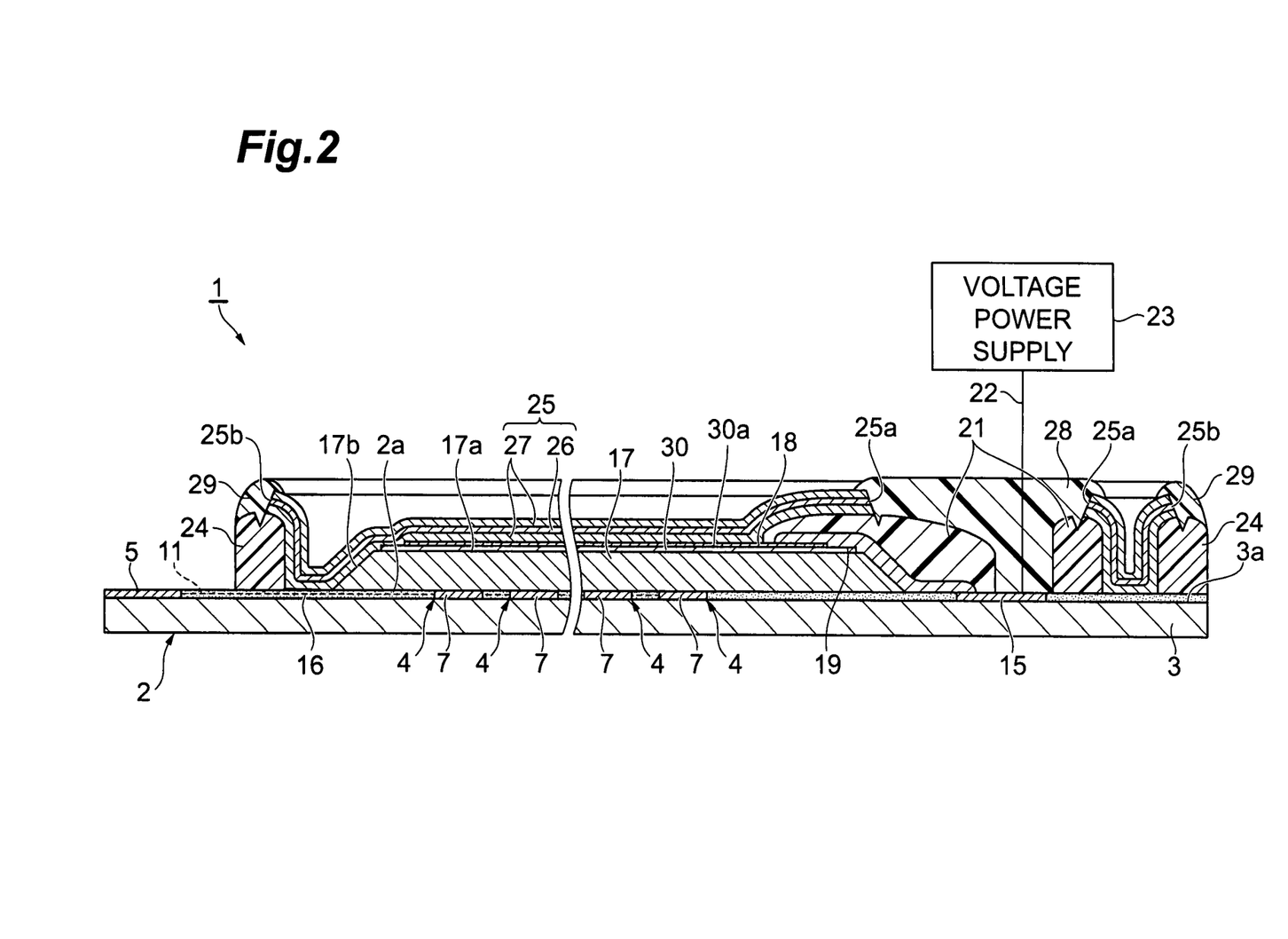
FIG. 2 is a sectional view along a line II-II in FIG. 1.
Figure 3:
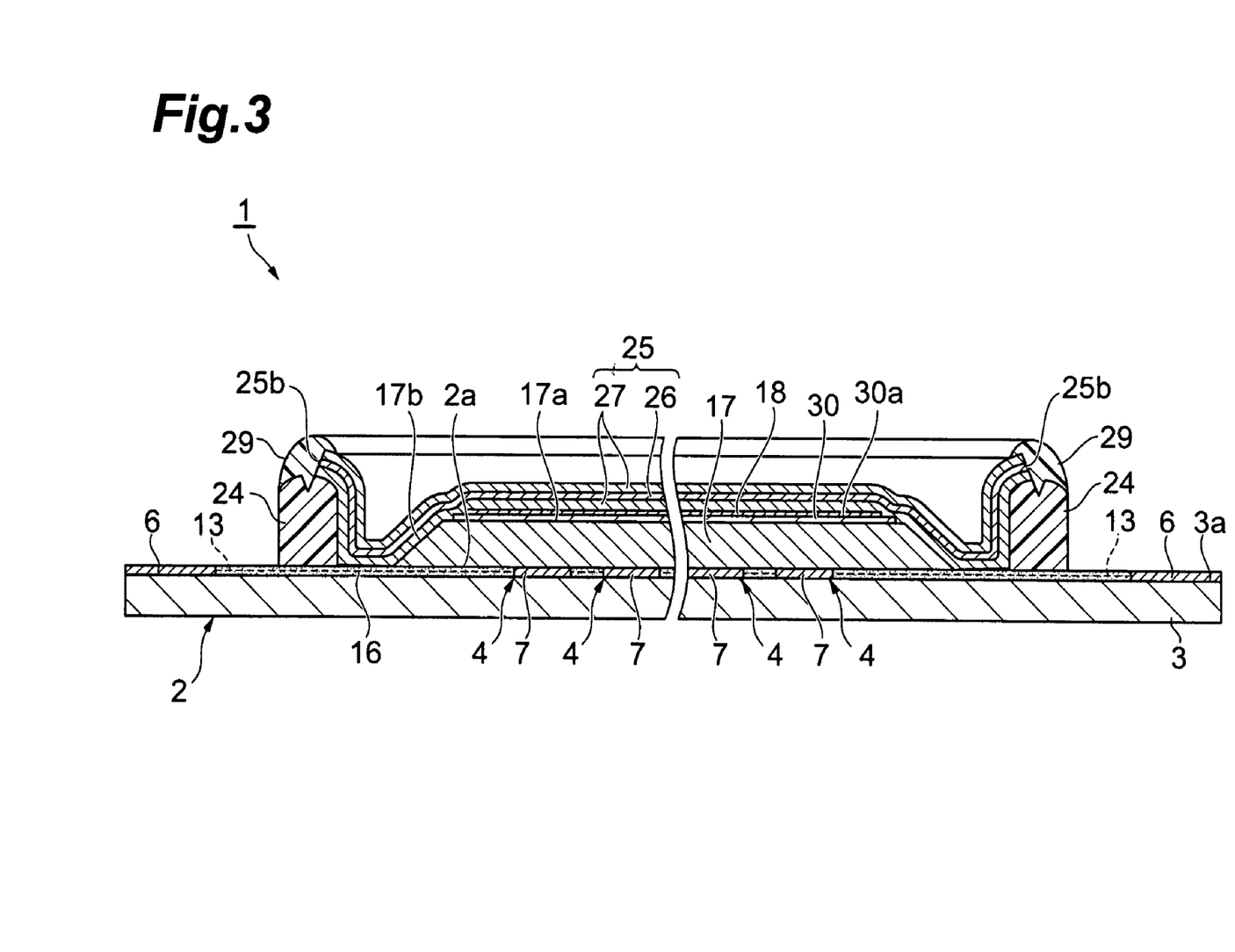
FIG. 3 is a sectional view along a line III-III in FIG. 1.

As shown in FIG. 1 to FIG. 3, a radiation detector 1 is for detecting X-rays (radiation) made incident from the front (upside in FIG. 2 and FIG. 3). This radiation detector 1 includes a signal readout substrate 2. The signal readout substrate 2 is constructed by arranging, in a rectangular effective pixel region R delimited on a front surface (one main surface) 3a of a rectangular substrate 3 made of an insulating material such as glass, a large number of pixel units 4 in a two-dimensional matrix form. In a region outside the effective pixel region R on the front surface 3a of the substrate 3, formed are a plurality of bonding pads 5 along one side of the substrate 3, and further formed in the same region are a plurality of bonding pads 6 along each of the two opposed sides of the substrate 3.

Figure 4:
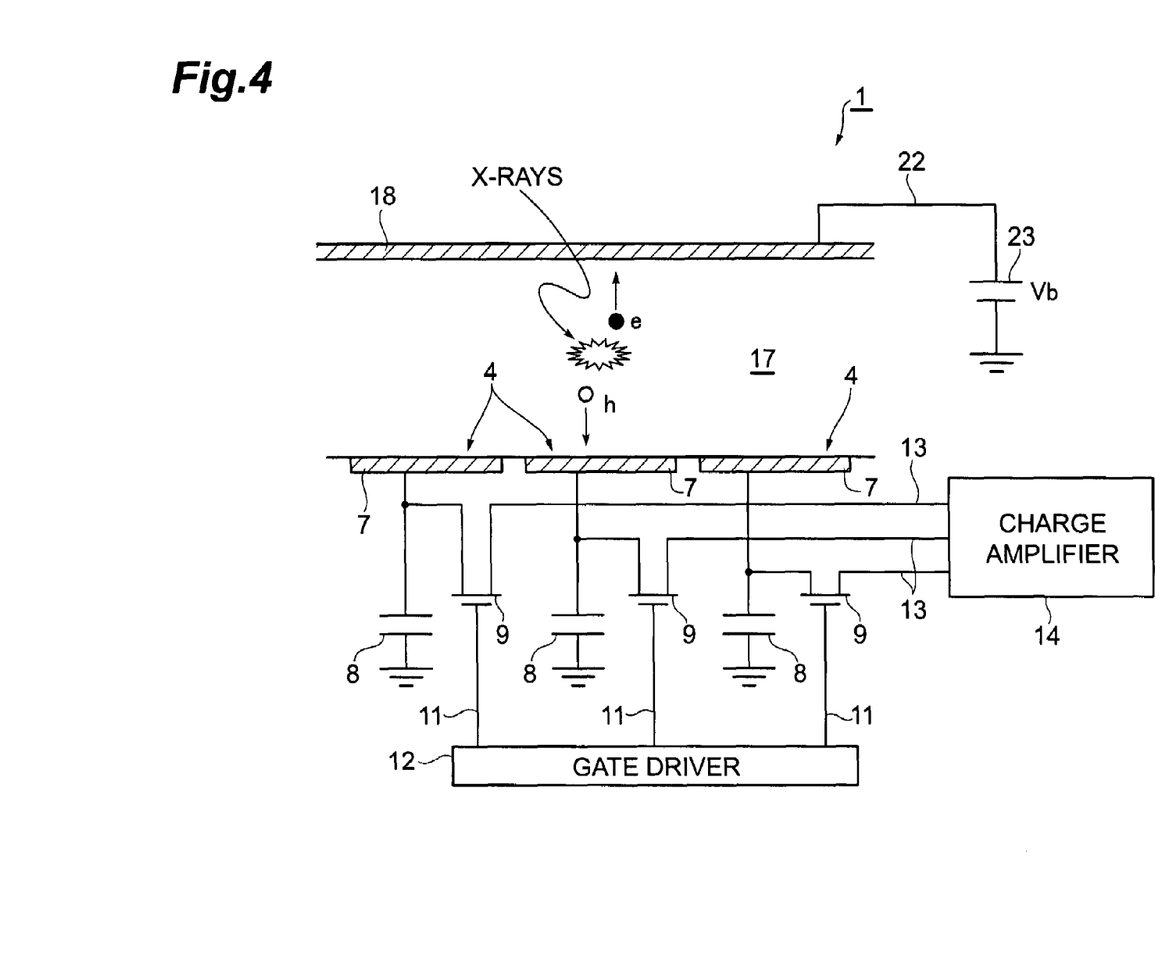
FIG. 4 is a conceptual view of the radiation detector of FIG. 1.

As shown in FIG. 4, each pixel unit 4 has a pixel electrode 7 for collecting a charge, a storage capacitor 8 for storing a charge collected in the pixel electrode 7, and a switching element 9 for reading out a charge stored in the storage capacitor 8. As a result, in the signal readout substrate 2, a large number of pixel electrodes 7 are arranged in a two-dimensional matrix form on the front surface 3a of the substrate 3. Also, the switching element 9 is, for example, a thin-film transistor (TFT), and is, for example, a C-MOS transistor when the substrate 3 is made of silicon.

Each switching element 9 is electrically connected with the bonding pad (see FIG. 2) by a signal line 11, and is further connected with a gate driver 12 that turns on and off the switching element 9 by a flexible printed circuit (FPC) board or the like. In addition, each storage capacitor 8 is electrically connected with the bonding pad 6 (see FIG. 3) by a signal line 13 via the switching element 9, and is further connected with a charge amplifier 14 that amplifies a charge stored in the storage capacitor 8 by an FPC board or the like.

As shown in FIG. 1 to FIG. 3, in the region outside the effective pixel region R on the front surface 3a of the substrate 3, a biasing pad (voltage supply pad) 15 is formed so as to be opposed to the bonding pads 5 across the effective pixel region R. Moreover, on the front surface 3a of the substrate 3, an insulating planarizing film 16 is formed so that the front surfaces of the pixel electrodes 7, bonding pads 5 and 6, and biasing pad 15 are exposed and the signal lines 11 and 13 and the like are buried.

On a front surface (one main surface) 2a of the signal readout substrate 2, formed is a photoconductive layer (crystalline photoconductive layer) 17 so as to include the effective pixel region R (that is, so as to include all pixel electrodes 7) when viewed from the front (that is, the thickness direction of the substrate 3), and the photoconductive layer 17 is electrically connected to each pixel electrode 7.

The photoconductive layer 17 is made of a metal halide, for example, a lead iodide, and functions as a conversion element that absorbs X-rays and converts the same to a signal charge. This photoconductive layer 17 has crystallinity, that is, has a crystal structure, and is composed of crystals having a regular crystal form or structure. Concretely, when the photoconductive layer 17 is made of a lead iodide, the photoconductive layer 17 has a scale-like polycrystalline structure (see FIG. 5). The photoconductive layer 17 is formed in a truncated pyramidal form having a rectangular front surface (one main surface) that includes the effective pixel region R when viewed from the front and side surfaces 17b that are inclined surfaces. This is because, when depositing the photoconductive layer 17 on the front surface 2a of the signal readout substrate 2 using a mask, if the mask is in contact with the front surface 2a, a marginal part of the photoconductive layer 17 is also peeled off simultaneously while separating the mask from the front surface 2a, and thus it is necessary to keep the mask apart from the front surface 2a, and as a result, a part of the material (lead iodide) composing the photoconductive layer 17 enters under the mask.

On the front surface 17a of the photoconductive layer 17, formed is a contact assistance layer (conductive intermediate layer) 30 having conductivity. The contact assistance layer 30 is a high-resistance semiconductive thin film and is formed of diamond-like carbon (hereinafter, referred to as "DLC") which is made of a light element provided with corrosion resistance.

On a front surface (one main surface) 30a of the contact assistance layer 30, formed is a rectangular common electrode (common biasing electrode) 18 so as to include the effective pixel region R (that is, include all pixel electrodes 7) and so as to be included in the front surface 17a of the photoconductive layer 17 when viewed from the front.

Between the common electrode 18 and the biasing pad 15, laid is a connecting member 19 made of a conductive resin so as to contact with the side surface 17b of the photoconductive layer 17. Thereby, the common electrode 18 and the biasing pad 15 are electrically connected. Also, a contact between the connecting member 19 and the common electrode 18 is disposed, so as not to narrow an imaging region, outside the effective pixel region R (more specifically, an outer marginal region that surrounds the effective pixel region R in the common electrode 18 when viewed from the front).

On the front surface of the signal readout substrate 2, formed is an insulating convex portion 21 having a rectangular ring shape when viewed from the front, so as to surround the biasing pad 15 while opening the same in part and cover the whole of the connecting member 19. This insulating convex portion 21 is formed of an insulating resin that is satisfactory in adhesion to the biasing pad 15, the planarizing film 16, and the connecting member 19, for example, a UV-curable acrylic resin (such as WORLD ROCK No. 801-SET2 manufactured by Kyoritsu Chemical & Co., Ltd). To a part (opened portion) of the biasing pad 15 surrounded by this insulating convex portion 21, fixed is one end of the voltage supply line 22 by soldering or with a conductive adhesive. Thereby, the biasing pad 15 and a voltage power supply 23 are electrically connected, so that a bias voltage can be supplied to the common electrode 18 from the voltage power supply 23 via the biasing pad 15.

Furthermore, on the front surface 2a of the signal readout substrate 2, formed is a rectangular ring-shaped insulating convex portion 24 formed of an insulating resin that is satisfactory in adhesion to the planarizing film 16, for example, the same UV-curable acrylic resin as that of the insulating convex portion 21, so as to surround the photoconductive layer 17 and the insulating convex portion 21. In a region inside the insulating convex portion 24, formed is a protective layer 25 that reaches a top of the insulating convex portion 21, 24, so as to cover the photoconductive layer 17 and the common electrode 18 excluding the region inside the insulating convex portion 21. The protective layer 25 is constructed by an inorganic film 26 being sandwiched between organic films (insulating protective layers) 27. The inorganic film 26 is made of a material that absorbs a minimum amount of X-rays and blocks visible light, for example, aluminum. In addition, the organic films 27 are made of a material having insulating properties and excellent in moisture resistance, for example, a polyparaxylylene resin (such as product name: Parylene manufactured by ThreeBond Co., Ltd.). Consequently, the protective layer 25 provides, as a result of combination of the inorganic film 26 with the organic films 27 as described above, effects such as a reduction of noise by a blocking of visible light, an improvement in ease of handling by ensuring of insulating properties, and a prevention of deterioration in characteristics of the photoconductive layer 17 by a blocking of water vapor or gas in an external atmosphere.

In the inside of the insulating convex portion 21, filled is an insulating sealing member 28 made of a resin that has higher insulating properties than those of the organic films 27 and is satisfactory in adhesion to the insulating convex portion 21, for example, a silicone rubber (such as RTV-11 manufactured by GE silicones). The insulating sealing member 28 reaches the top of the insulating convex portion 21 and covers an inner marginal portion 25a of the protective film 25. Thereby, the insulating sealing member 28 contacts with inner marginal portions of the organic films 27. Also, in order to prevent an outside marginal portion 25b of the protective layer 25 from peeling, disposed in a rectangular ring shape on the top of the insulating convex portion 24 is an insulating fixing member 29 made of a material satisfactory in adhesion to the insulating convex portion 24 and the organic films 27, for example, the same UV-curable acrylic resin as that of the insulating convex portion 21, and the insulating fixing member 29 covers the outside marginal portion 25b of the protective layer 25.

Figure 5:
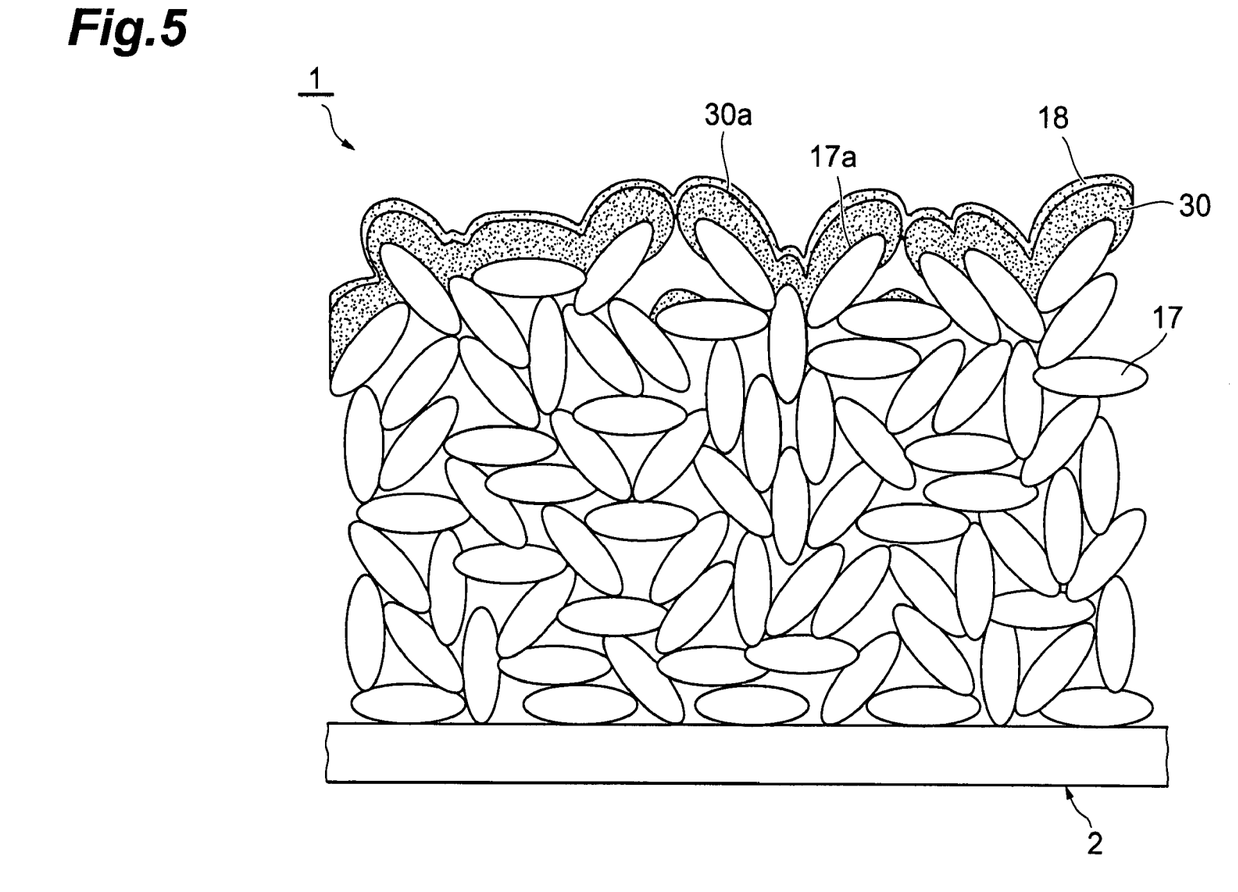
FIG. 5 is an enlarged schematic view for explaining a common electrode of the radiation detector of FIG. 1.

In the radiation detector 1, as described above, formed is the contact assistance layer 30 so as to be interposed between the photoconductive layer 17 and the common electrode 18. And, as shown in FIG. 5, a surface area per unit region of the front surface 30a of the contact assistance layer 30 is smaller than the surface area per unit region of the front surface 17a of the photoconductive layer 17. Here, the unit region means a region corresponding to a unit area when viewed from the front (upside in FIG. 5).

Returning now to FIG. 1 and FIG. 3, this contact assistance layer 30 is formed so as to include the common electrode 18 and so as to be included in the front surface 17a of the photoconductive layer 17 when viewed from the front (one side) (when viewed from the thickness direction of the substrate 3). In other words, the contact assistance layer 30 is formed so as be stayed in the front surface 17a of the photoconductive layer 17, while the common electrode 18 is formed so as to be stayed in the front surface 30a of the contact assistance layer 30. That is, the region where the contact assistance layer 30 is formed is, when viewed from the front), limited to a range broader than the region of the common electrode 18 and narrower than the region of the front face 17a of the photoconductive layer 17.

The contact assistance layer 30 is, as described above, a high-resistance semiconductive thin film formed of DLC. And, its thickness is provided as 1 μm to 5 μm. Moreover, the contact assistance layer 30 is doped with nitrogen atoms, so that its specific resistance value becomes $10^{-2}$ to $10^{-6}$ times as large as that of the photoconductive layer 17. Concretely, by doping nitrogen atoms in contact assistance layer 30 equal to 3% to 15% in number relative to a total value of the numbers of carbon atoms and nitrogen atoms contained in the contact assistance layer 30, the specific resistance value of the contact assistance layer is adjusted to $10^6 \Omega \cdot cm$ to $10^{10} \Omega \cdot cm$. Furthermore, the contact assistance layer 30 is a reddish brown or black color, whereby the light blocking effect of the contact assistance layer 30 is enhanced and photosensitivity due to light other than radiation from the outside is reduced in the photoconductive layer 17. In addition, since the contact assistance layer 30 made of DLC is also provided with corrosion resistance, this prevents the contact assistance layer 30 from reacting with halogen being a constituent of the photoconductive layer 17 to corrode the contact assistance layer 30.

Description will be given of actions of the radiation detector 1 constructed as in the above. As shown in FIG. 4, when X-rays are made incident into the photoconductive layer 17 from the front, the X-rays are absorbed in the photoconductive layer 17 and a signal charge proportional to the amount of absorbed X-rays is generated. At this time, since a bias voltage Vb (a high voltage on the order of 500V to 1000V) is being applied to the common electrode 18 by the voltage power supply 23, the signal charge generated by the photoconductive layer 17 moves along an electric field inside the photoconductive layer 17, is collected in the pixel electrode 7, and is stored in the storage capacitor 8. Then, each switching element 9 is turned on and off by the gate driver 12 in sequence, and the charge that has been stored in each storage capacitor 8 is read out and amplified by the charge amplifier 14 in sequence, whereby a two-dimensional radiographic image is obtained.

Figure 10:
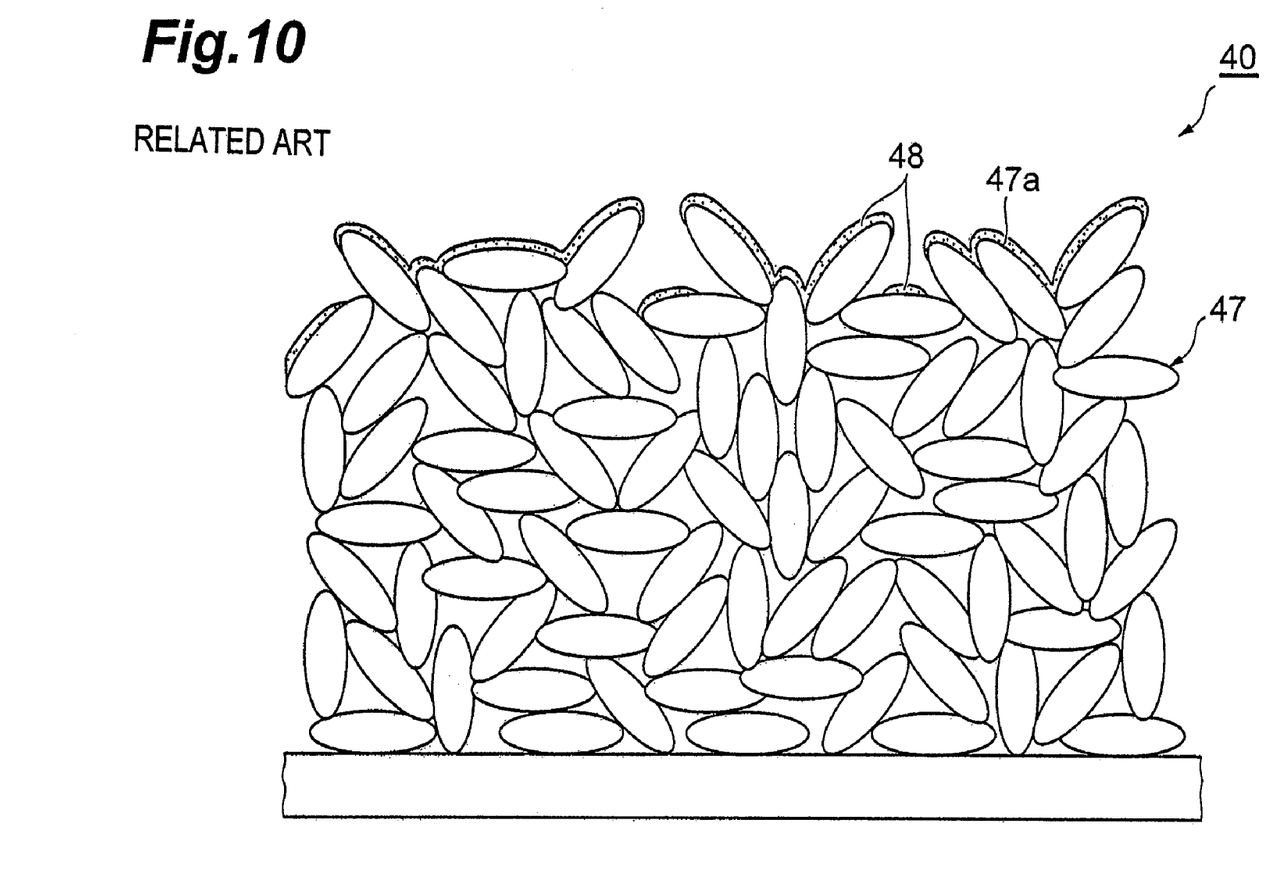
FIG. 10 is an enlarged schematic view for explaining a common electrode of a conventional radiation detector.

Meanwhile, as shown in FIG. 10, in the conventional radiation detector 40, since the photoconductive layer 47 has crystallinity, unevenness exists on the front surface 47a of the photoconductive layer 47. Therefore, when it is attempted to form the common electrode 48 on the front surface of the photoconductive layer 47, it is easy to form the common electrode 48 on convex parts of said front surface 47a, while it is difficult to form the common electrode 48 on concave parts (parts hidden behind crystal grains). For this reason, in the conventional radiation detector 40, there is a possibility that the common electrode 48 becomes locally thin or is divided to be disconnected, and as a result, the common electrode 48 can possibly have a high resistance or said common electrode 48 may be electrically disconnected.

Therefore, in the radiation detector 1, as described above, the surface area per unit region of the front surface 30a of the contact assistance layer 30 is made smaller than the surface area per unit region of the front surface 17a of the photoconductive layer 17. Thereby, the degree of unevenness of the front surface 30a of the contact assistance layer 30 is moderated relative to the degree of unevenness of the front surface 17a of the photoconductive layer 17. Therefore, by not directly forming the common electrode 18 on the front surface 17a of the photoconductive layer 17, but by forming the contact assistance layer 30 on the front surface 17a of the photoconductive layer 17 and then forming the common electrode 18 on the front surface 30a of said contact assistance layer 30 as described above, the common electrode 18 can be prevented from being discontinuously formed (see FIG. 5). As a result, it is not necessary to thicken said common electrode in order to suppress the common electrode from having a high resistance, and thus the phenomenon that the common electrode is easily peeled off since said common electrode is thick is prevented. Accordingly, by the radiation detector 1, not only does it become possible to suppress the common electrode 18 from having a high resistance, but peeling of the common electrode 18 can also be prevented, so that the efficiency in collecting a signal charge is improved, and it becomes possible to detect radiation at a high sensitivity.

In addition, as described above, the contact assistance layer 30 is formed so as to include the common electrode 18 and so as to be included in the front surface 17a of the photoconductive layer 17 when viewed from the front. Therefore, peeling of the common electrode 18 due to peeling of the contact assistance layer 30 can be prevented. This is based on the following reasons. Specifically, although a stress (an internal stress) is generated inside the contact assistance layer 30 when forming the contact assistance layer 30, since the front surface 17a of the photoconductive layer 17 has unevenness, a contact assistance layer formed on said front surface 17a is relatively unaffected by the stress and thus difficult to peel off. On the other hand, since a region (including the side surface 17b of the photoconductive layer 17) where the photoconductive layer 17 is not formed on the front surface 2a of the signal readout substrate 2 is smooth and thus greatly affected by the stress, a contact assistance layer formed on said region is easy to peel off. Accordingly, by forming the contact assistance layer 30 so as to include the common electrode 18 and so as to be included in the front surface 17a of the conductive layer 17 when viewed from the front as such, the photoconductive layer 17 and the contact assistance layer 30 can be reliably joined to each other.

Furthermore, as a result of the photoconductive layer 17 and the contact assistance layer 30 being reliably joined to each other as such, not only can a phenomenon that, for example, the contact assistance layer 30 is peeled, and fragments thereof contact with the bonding pads 5, 6 to cause a short circuit to be prevented, but a phenomenon that the fragments put on the effective pixel region R to cause a local image defect also to be prevented. Moreover, it becomes possible to supply a bias voltage to the photoconductive layer 17 almost uniformly to improve traveling performance of carriers in said photoconductive layer 17.

Figure 6:
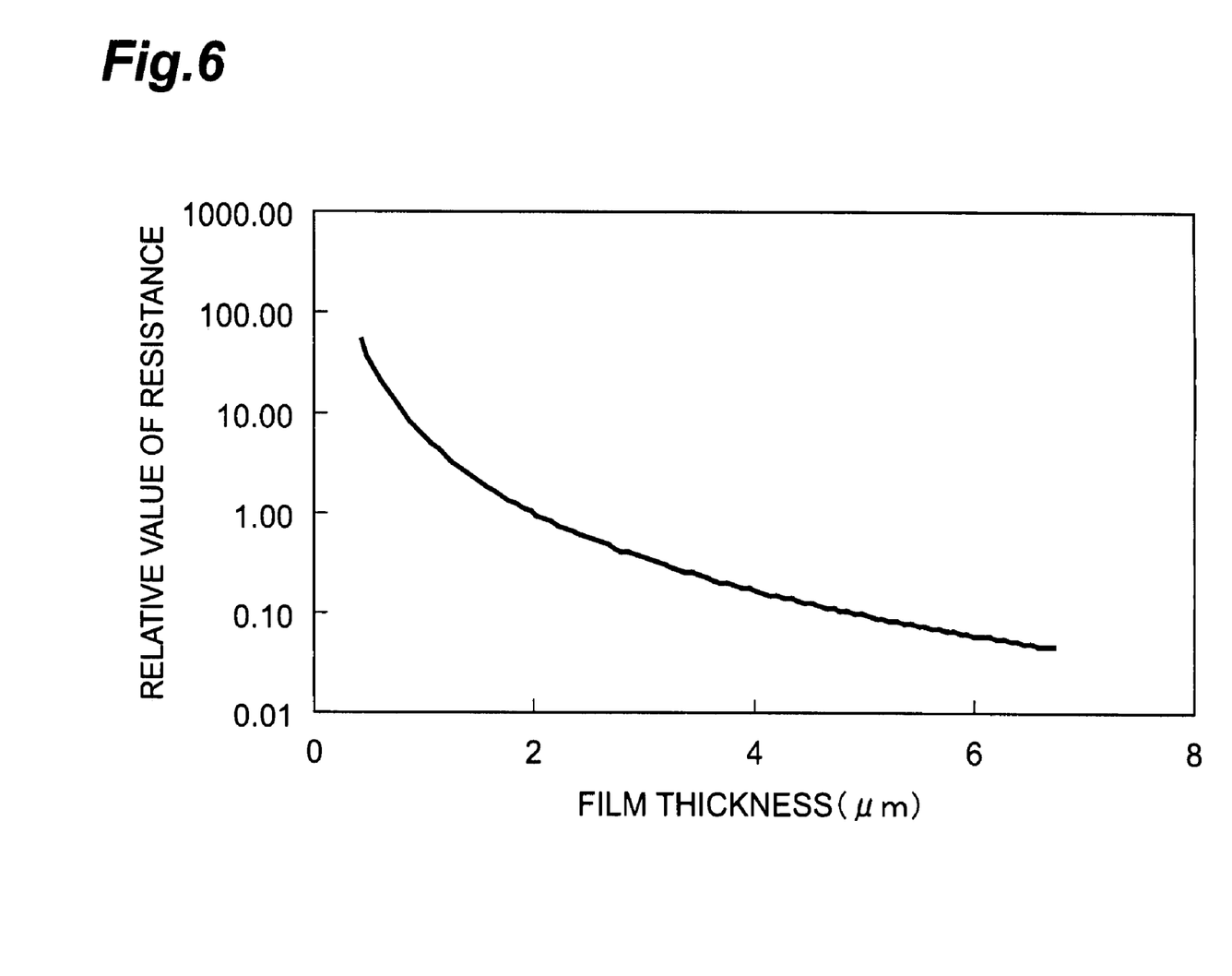
FIG. 6 is a diagram showing experimental results of a relationship between the film thickness of a contact assistance layer and the resistance value of a common electrode.
Figure 7:
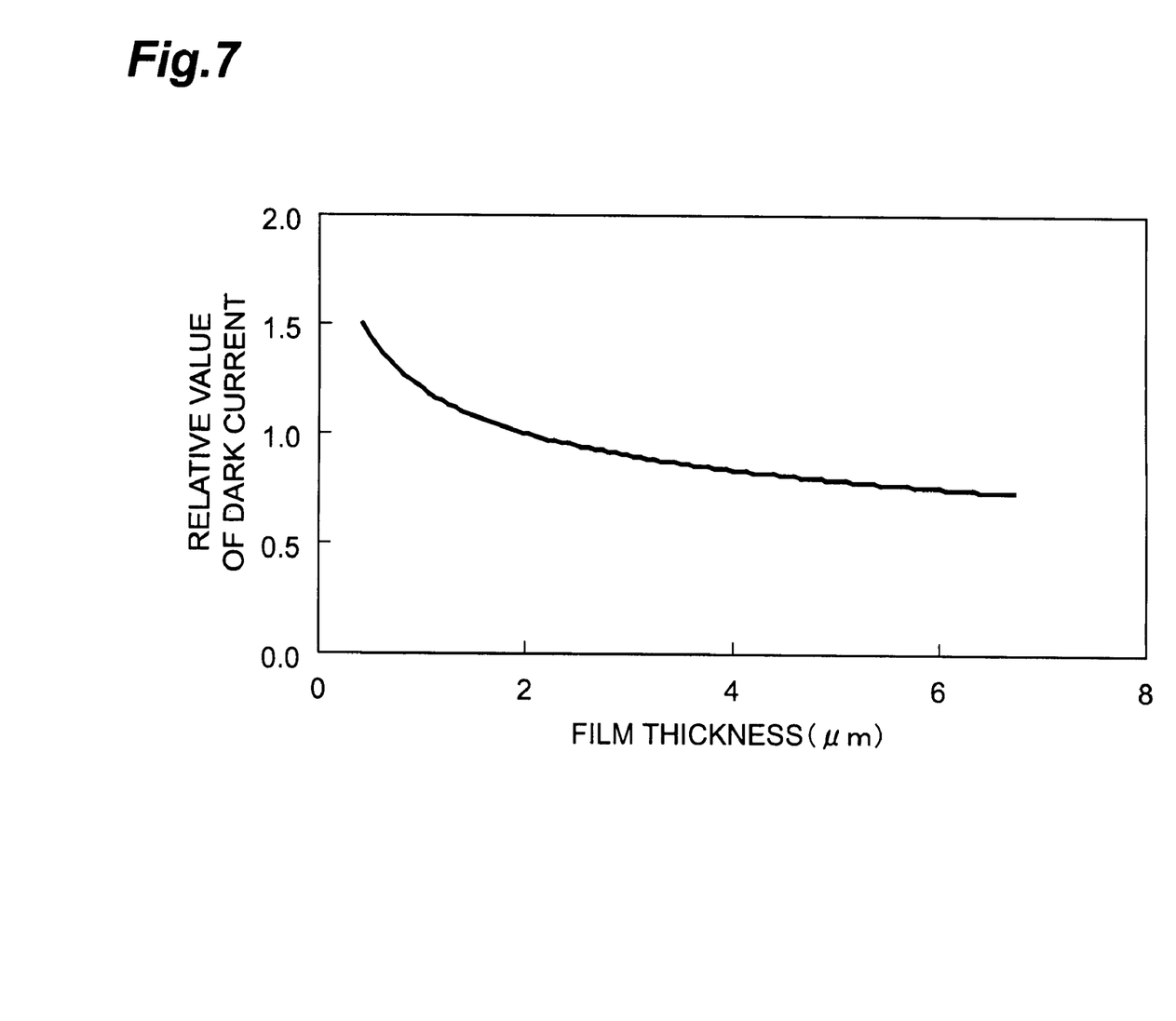
FIG. 7 is a diagram showing experimental results of a relationship between the film thickness of a contact assistance layer and a dark current

Here, when the contact assistance layer 30 is thin, it is impossible to sufficiently fill in gaps between the crystals on the front surface 17a of the photoconductive layer 17 (sufficiently moderate the degree of unevenness), so that the common electrode 18 becomes locally thin or is discontinuously formed (formed in a divided manner). Therefore, as shown in FIG. 6, the relative value of a resistance of the common electrode 18 has a characteristic of being remarkably increased as the contact assistance layer 30 becomes thinner. Furthermore, when the contact assistance layer 30 is thin, the effect to prevent an unnecessary charge from being injected into the photoconductive layer 17 becomes insufficient. Therefore, as shown in FIG. 7, the relative value of a dark current that flows through the photoconductive layer 17 has a characteristic of being remarkably increased as the contact assistance layer 30 becomes thinner.

Figure 8:
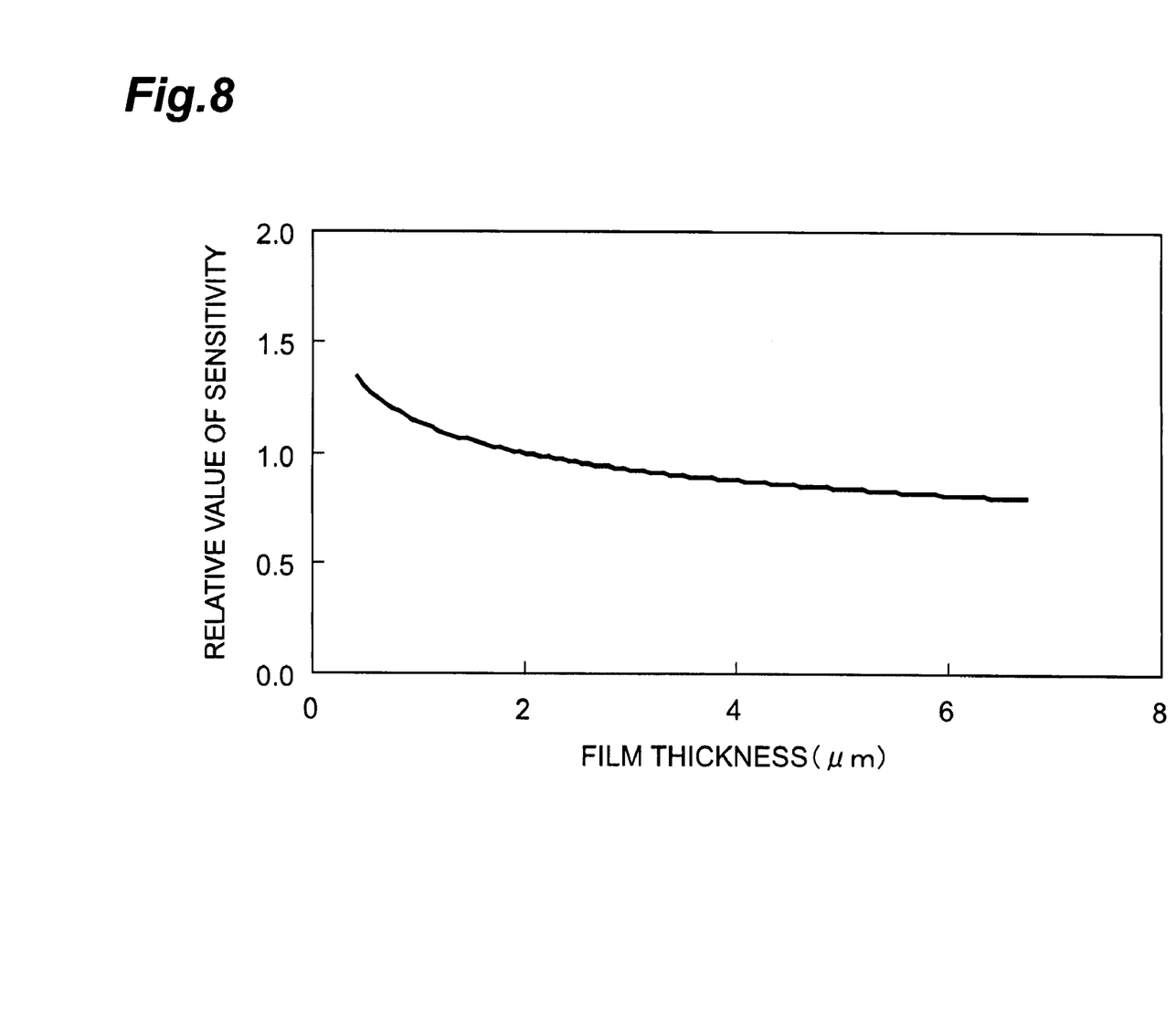
FIG. 8 is a diagram showing experimental results of a relationship between the film thickness of a contact assistance layer and a sensitivity to radiation.

In addition, if the contact assistance layer 30 is thin, a signal charge lost by a recombination or trapping in said layer is small, so that a signal charge to be extracted is increased, while if the contact assistance layer 30 is thick, a signal charge lost by a recombination or trapping in said layer is increased, so that a signal charge to be extracted is reduced. Therefore, as shown in FIG. 8, the relative value of a sensitivity of the photoconductive layer 17 to radiation has a characteristic of being lowered as the contact assistance layer becomes thicker.

Figure 9:
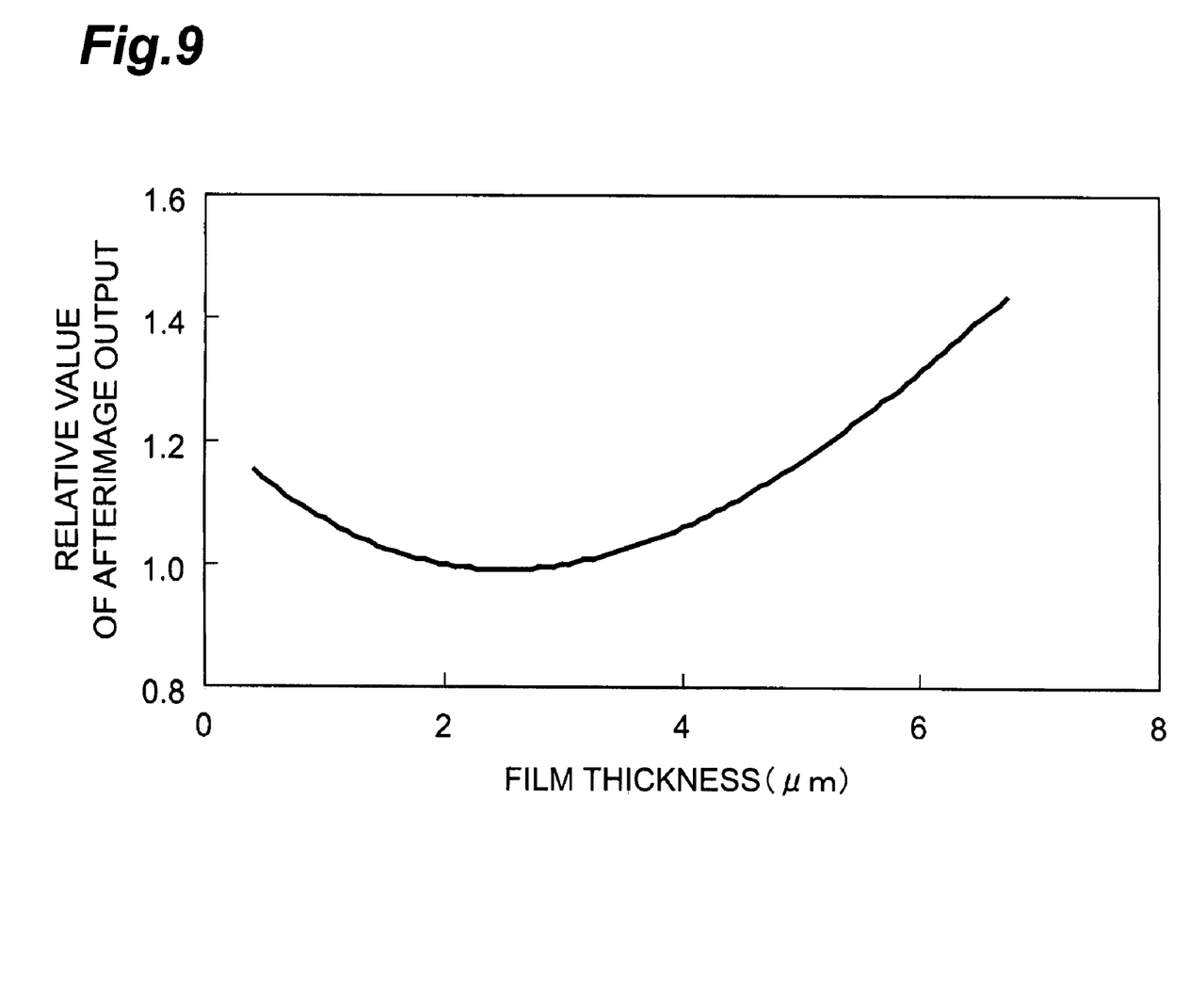
FIG. 9 is a diagram showing experimental results of a relationship between the film thickness of a contact assistance layer and an image lag (afterimage output) characteristics.

Moreover, when the contact assistance layer 30 is thick, since a signal charge trapped in the contact assistance layer 30 is increased, time response of the signal charge is deteriorated. In addition, when the contact assistance layer 30 is thin as well, the effect to prevent an unnecessary charge from being injected into the photoconductive layer 17 becomes insufficient, and time response of the signal charge is deteriorated. This is because an unnecessary charge has the quality that the greater the signal charge, the greater the injection thereof promoted, and the injected unnecessary charge is low in mobility. Therefore, as shown in FIG. 9, the relative value of image lag characteristics (the amount of an output signal charge remaining after an elapse of a predetermined time since an X-ray incidence was blocked) has a characteristic of being deteriorated as the thickness of the contact assistance layer 30 becomes thicker or thinner than a predetermined thickness (here, 2.5 µm).

In view of these characteristics, that is, various characteristics (common electrode resistance, dark current, sensitivity to radiation, and image lag characteristics) according to the film thickness of the contact assistance layer 30, in the radiation detector 1 of the present embodiment, the thickness of the contact assistance layer 30 is determined so that said various characteristics satisfy required performances. Specifically, in the radiation detector 1, as described above, the thickness of the contact assistance layer 30 is provided as 1 µm to 5 µm. Accordingly, it becomes possible to detect radiation at a high sensitivity while suppressing the common electrode 18 from having a high resistance.

In addition, as described above, by providing the specific resistance value of the contact assistance layer 30 as $10^{-2}$ to $10^{-6}$ times as large as that of the photoconductive layer 17, a signal charge generated in the photoconductive layer 17 can be smoothly moved to the common electrode 18 via the contact assistance layer 30.

In addition, as described above, the contact assistance layer 30 is formed of DLC. Since DLC has a characteristic of being difficult to absorb radiation, absorption of X-rays in the contact assistance layer 30 is minimal. Accordingly, X-rays can be effectively absorbed and converted to a signal charge in the photoconductive layer 17, so that it becomes possible to detect X-rays at a high sensitivity.

Furthermore, as described above, nitrogen atoms are doped into the contact assistance layer 30 that is DLC. Thereby, it becomes possible to lower the specific resistance value of the contact assistance layer 30 and easily adjust the specific resistance value of said contact assistance layer 30 to a desirable value ($10^{-2}$ to $10^{-6}$ times as large as that of the photoconductive layer 17). Also, since DLC doped with no nitrogen atoms or the like has a high specific resistance value, if a contact assistance layer is formed of this non-doped DLC, when this is formed with a film thickness necessary for sufficiently moderating the degree of unevenness of the front surface 17a of the photoconductive layer 17, a decline in the sensitivity to radiation and a deterioration in the image lag characteristics can possibly occur.

In the above, the preferred embodiment of the present invention has been described, however, the present invention is not limited to the above embodiment. For example, the radiation detector 1 of the above embodiment is for detecting X-rays, however, this may be for detecting electromagnetic waves (γ-rays) different in the wavelength range or other electromagnetic waves.

Moreover, in the above embodiment, the contact assistance layer 30 has been formed of DLC, however, the contact assistance layer may be formed such as a-Si (amorphous silicon), a-SiC (amorphous silicon carbide), or a conductive organic compound such as Alq3 (tris(8-quinolinolato) aluminum).

Moreover, in the above embodiment, the pixel units 4 having the pixel electrodes 7 have been formed on the front surface 3a of the substrate 3, however, it is sufficient that these are formed on the front surface side of the substrate. Furthermore, although the photoconductive layer 17 has been formed on the front surface 2a of the signal readout substrate 2, it is sufficient that this is formed on the front surface side of the signal readout substrate, and although the contact assistance layer 30 has been formed on the front surface 17a of the photoconductive layer 17, it is sufficient that this is formed on the front surface side of the photoconductive layer.

Moreover, although the pixel units 4 have been arranged in a two-dimensional matrix form in the effective pixel range R of the signal readout substrate 2, as a matter of course, these may be arranged in a one-dimensional form.

According to the present invention, it becomes possible to not only suppress the common electrode from having a high resistance but also prevent the common electrode from peeling.

What is claimed is:

1. A radiation detector for detecting radiation, comprising:
    a first substrate and a signal readout substrate having a plurality of pixel electrodes arranged one-dimensionally or two-dimensionally on one main-surface side of said first substrate;
    a crystalline photoconductive layer formed on one main-surface side of the signal readout substrate;
    a conductive intermediate layer formed on one main-surface side of the crystalline photoconductive layer; and
    a common electrode formed on one main surface of the conductive intermediate layer, wherein
    a surface area per unit region of the one main surface of the conductive intermediate layer is smaller than a surface area per unit region of one main surface of the crystalline photoconductive layer,
    the conductive intermediate layer is formed so as to include the common electrode and so as to be included in the one main surface of the crystalline photoconductive layer when viewed from one side, and
    a region of the conductive intermediate layer is limited to a range broader than a region of the common electrode and narrower than a region of the one main surface of the crystalline photoconductive layer when viewed from one side.

2. The radiation detector according to claim 1, wherein a thickness of the conductive intermediate layer is 1 μm to 5 μm.

3. The radiation detector according to claim 1, wherein a specific resistance value of the conductive intermediate layer is $10^{-2}$ to $10^{-6}$ times as large as a specific resistance value of the crystalline photoconductive layer.

4. The radiation detector according to claim 1, wherein the conductive intermediate layer contains diamond-like carbon.

5. The radiation detector according to claim 4, wherein the conductive intermediate layer is doped with nitrogen atoms.

6. A radiation detector for detecting radiation, comprising:
    a first substrate and a signal readout substrate having a plurality of pixel electrodes arranged one-dimensionally or two-dimensionally on one main-surface side of said first substrate;
    a crystalline photoconductive layer formed on one main-surface side of the signal readout substrate;
    a conductive intermediate layer formed on one main-surface side of the crystalline photoconductive layer; and
    a common electrode formed on one main surface of the conductive intermediate layer, wherein
    the conductive intermediate layer is to suppress its common electrode from having a high resistance and to prevent the common electrode from peeling, and
    a surface area per unit region of the one main surface of the conductive intermediate layer is smaller than a surface area per unit region of one main surface of the crystalline photoconductive layer, and
    a thickness of the conductive intermediate layer is 1 μm to 5 μm.

* * * * *